(12) United States Patent
Busche et al.

(10) Patent No.: US 10,736,182 B2
(45) Date of Patent: Aug. 4, 2020

(54) APPARATUS, SYSTEMS, AND METHODS FOR TEMPERATURE CONTROL OF SUBSTRATES USING EMBEDDED FIBER OPTICS AND EPOXY OPTICAL DIFFUSERS

(71) Applicant: Applied Materials, Inc., Santa Clara, CA (US)

(72) Inventors: Matthew Busche, Santa Clara, CA (US); Wendell Boyd, Jr., Morgan Hill, CA (US); Todd J. Egan, Fremont, CA (US); Gregory L. Kirk, Pleasanton, CA (US); Vijay D. Parkhe, San Jose, CA (US); Michael R. Rice, Pleasanton, CA (US); Leon Volfovski, Pacifica, CA (US)

(73) Assignee: Applied Materials, Inc., Santa Clara, CA (US)

( * ) Notice: Subject to any disclaimer, the term of this patent is extended or adjusted under 35 U.S.C. 154(b) by 248 days.

(21) Appl. No.: 14/738,448

(22) Filed: Jun. 12, 2015

(65) Prior Publication Data

US 2016/0007412 A1    Jan. 7, 2016

Related U.S. Application Data

(60) Provisional application No. 62/020,367, filed on Jul. 2, 2014.

(51) Int. Cl.
```
H05B 3/26      (2006.01)
H01L 21/67     (2006.01)
H05B 3/14      (2006.01)
```
(52) U.S. Cl.
CPC ....... *H05B 3/265* (2013.01); *H01L 21/67103* (2013.01); *H01L 21/67248* (2013.01);
(Continued)

(58) Field of Classification Search
CPC .... H05B 3/265; H05B 3/14; H05B 2203/032; H05B 2203/037; H05B 3/00; H05B 3/06;
(Continued)

(56) References Cited

U.S. PATENT DOCUMENTS

| | | | |
|---|---|---|---|
| 4,662,368 A | 5/1987 | Hussein et al. | |
| 4,702,547 A | 10/1987 | Enochs | |

(Continued)

FOREIGN PATENT DOCUMENTS

| | | |
|---|---|---|
| CN | 101112939 A | 1/2008 |
| CN | 101118795 A | 2/2008 |

(Continued)

OTHER PUBLICATIONS

Okada, et al, Optical Transmission Device and Optical Transmission System, Jun. 20, 2003, JP2003172850A, Espacenet translation, Description, Drawings (Year: 2003).*

(Continued)

*Primary Examiner* — Tu B Hoang
*Assistant Examiner* — Masahiko Muranami
(74) *Attorney, Agent, or Firm* — Lowenstein Sandler LLP (57) ABSTRACT

Substrate temperature control apparatus and electronic device manufacturing systems provide pixelated light-based heating to a substrate in a process chamber. A substrate holder in the process chamber may include a baseplate. The baseplate has a top surface that may have a plurality of cavities and a plurality of grooves connected to the cavities. Optical fibers may be received in the grooves such that each cavity has a respective optical fiber terminating therein to transfer light thereto. Some or all of the cavities may have an epoxy optical diffuser disposed therein to diffuse light provided by the optical fiber. A ceramic plate upon which a substrate may be placed may be bonded to the baseplate. A thermal spreader plate may optionally be provided between (Continued)

the baseplate and the ceramic plate. Methods of controlling temperature across a substrate holder in an electronic device manufacturing system are also provided, as are other aspects.

9 Claims, 12 Drawing Sheets (52) U.S. Cl.
CPC .......... *H05B 3/14* (2013.01); *H05B 2203/032* (2013.01); *H05B 2203/037* (2013.01)

(58) Field of Classification Search
CPC ..... H05B 3/26; H05B 3/744; H01L 21/67103; H01L 21/67248; H01L 21/67; H01L 33/60; H01L 33/642
USPC ....... 392/229, 346, 408, 354, 355, 412, 413, 392/416, 418, 432, 434, 435, 439; 118/725, 500, 50.1, 52, 666, 724, 728, 118/59, 729, 730, 731, 732, 733; 219/405, 390, 411, 444.1, 468.2; 156/345.51, 345.52, 345.53, 345.54, 156/345.55
See application file for complete search history.

(56) References Cited

U.S. PATENT DOCUMENTS

| | | | | |
|---|---|---|---|---|
| 4,994,060 | A * | 2/1991 | Rink | A61B 18/28 606/15 |
| 5,140,220 | A * | 8/1992 | Hasegawa | F21V 3/00 257/E33.059 |
| 5,363,458 | A | 11/1994 | Pan et al. | |
| 5,425,831 | A | 6/1995 | Grimes et al. | |
| 5,500,556 | A | 3/1996 | Kosugi | |
| 5,616,261 | A * | 4/1997 | Forrest | B23K 26/067 219/121.63 |
| 5,699,461 | A | 12/1997 | Minemoto et al. | |
| 6,080,965 | A * | 6/2000 | Osawa | H01L 21/67115 118/725 |
| 6,319,321 | B1 * | 11/2001 | Hiraga | B05D 1/60 118/50.1 |
| 6,406,179 | B2 | 6/2002 | Adams et al. | |
| 6,490,146 | B2 | 12/2002 | Wang et al. | |
| 6,535,685 | B1 | 3/2003 | Tullis | |
| 6,538,872 | B1 | 3/2003 | Wang et al. | |
| 6,642,484 | B2 * | 11/2003 | Eggert | C23C 14/541 118/724 |
| 6,646,235 | B2 | 11/2003 | Chen et al. | |
| 6,740,853 | B1 | 5/2004 | Johnson et al. | |
| 6,818,864 | B2 * | 11/2004 | Ptak | C23C 16/481 118/50.1 |
| 7,190,862 | B1 * | 3/2007 | Peterson | G02B 6/3502 385/16 |
| 7,519,252 | B2 | 4/2009 | Morita | |
| 8,226,769 | B2 | 7/2012 | Matyushkin et al. | |
| 8,461,674 | B2 | 6/2013 | Gaff et al. | |
| 8,546,732 | B2 | 10/2013 | Singh | |
| 8,587,113 | B2 | 11/2013 | Gaff et al. | |
| 8,624,168 | B2 | 1/2014 | Gaff et al. | |
| 8,637,794 | B2 | 1/2014 | Singh et al. | |
| 8,663,391 | B2 | 3/2014 | Matyushkin et al. | |
| 8,884,194 | B2 | 11/2014 | Singh et al. | |
| 8,937,800 | B2 | 1/2015 | Lubomirsky et al. | |
| 9,196,514 | B2 | 11/2015 | Parkhe et al. | |
| 9,224,583 | B2 | 12/2015 | Povolny et al. | |
| 2002/0179585 | A1 * | 12/2002 | Maltabes | H01L 21/67103 219/390 |
| 2003/0062359 | A1 | 4/2003 | Ho et al. | |
| 2007/0000441 | A1 | 1/2007 | Lue | |
| 2008/0017104 | A1 | 1/2008 | Matyushkin et al. | |
| 2008/0019657 | A1 | 1/2008 | Maitland et al. | |
| 2008/0039000 | A1 | 2/2008 | Bennett et al. | |
| 2008/0247739 | A1 | 10/2008 | Sohtome | |
| 2008/0251019 | A1 | 10/2008 | Krishnaswami et al. | |
| 2009/0111276 | A1 | 4/2009 | Dhindsa et al. | |
| 2010/0267173 | A1 * | 10/2010 | Moffatt | B23K 26/0604 438/16 |
| 2011/0005686 | A1 | 1/2011 | Tanaka et al. | |
| 2011/0024047 | A1 | 2/2011 | Nguyen et al. | |
| 2012/0211933 | A1 | 8/2012 | Goto | |
| 2013/0065011 | A1 * | 3/2013 | Suzuki | H01L 23/36 428/77 |
| 2013/0081447 | A1 | 4/2013 | Carter et al. | |
| 2013/0126509 | A1 * | 5/2013 | He | H01L 21/67115 219/209 |
| 2013/0161305 | A1 | 6/2013 | Ptasienski et al. | |
| 2013/0220989 | A1 | 8/2013 | Pease et al. | |
| 2014/0045337 | A1 * | 2/2014 | Singh | C23C 14/541 438/710 |
| 2014/0047705 | A1 | 2/2014 | Singh et al. | |
| 2014/0048529 | A1 | 2/2014 | Pease | |
| 2014/0096909 | A1 | 4/2014 | Singh et al. | |
| 2014/0133799 | A1 | 5/2014 | Yasuda et al. | |
| 2014/0154819 | A1 | 6/2014 | Gaff et al. | |
| 2015/0129165 | A1 | 5/2015 | Parkhe et al. | |
| 2015/0155193 | A1 | 6/2015 | Hsu et al. | |
| 2015/0170977 | A1 | 6/2015 | Singh | |
| 2015/0187625 | A1 | 7/2015 | Busche et al. | |
| 2015/0187626 | A1 | 7/2015 | Parkhe et al. | |
| 2015/0228513 | A1 | 8/2015 | Parkhe et al. | |
| 2015/0311105 | A1 | 10/2015 | Sadjadi et al. | |
| 2015/0364354 | A1 | 12/2015 | Tantiwong et al. | |
| 2015/0366004 | A1 | 12/2015 | Nangoy et al. | |
| 2016/0007411 | A1 | 1/2016 | Busche et al. | |
| 2016/0027678 | A1 | 1/2016 | Parkhe et al. | |
| 2017/0303338 | A1 | 10/2017 | Parkhe | |

FOREIGN PATENT DOCUMENTS

| | | | | |
|---|---|---|---|---|
| CN | 102792442 | A | 11/2012 | |
| EP | 0458388 | | 11/1991 | |
| JP | H06009187 | U | 2/1994 | |
| JP | H09148258 | A * | 6/1997 | ............ C23C 16/52 |
| JP | H09148258 | A | 6/1997 | |
| JP | H09186095 | A | 7/1997 | |
| JP | 2003-161845 | | 6/2003 | |
| JP | 2003172850 | A * | 6/2003 | ............ G02B 6/40 |
| JP | 2003172850 | A | 6/2003 | |
| JP | 2014095800 | A | 5/2014 | |
| KR | 10-2007-0096958 | | 10/2007 | |
| KR | 200448307 | Y1 | 3/2010 | |
| WO | 2013162000 | A1 | 10/2013 | |

OTHER PUBLICATIONS

Sato, Vapor Growth Device, Jun. 6, 1997, JPH09148258A, Espacenet translation, Description, Drawings (Year: 1997).*
International Search Report and Written Opinion of International Application No. PCT/US2015/035643 dated Sep. 11, 2015.
International Preliminary Report on Patentability of International Application No. PCT/US2015/035643 dated Jan. 12, 2017.
Busche et al., U.S. Appl. No. 14/299,850 titled: "Substrate Temperature Control Apparatus Including Optical Fiber Heating, Substrate Temperature Control Systems, Electronic Device Processing Systems, and Methods," filed Jun. 9, 2014.
Busche et al., U.S. Appl. No. 14/737,799 titled: "Temperature Control Apparatus Including Groove-Routed Optical Fiber Heating, Substrate Temperature Control Systems, Electronic Device Processing Systems, and Processing Methods," filed Jun. 12, 2015.
Parkhe et al., U.S. Appl. No. 14/085,026, titled: "Electrostatic Chuck With Variable Pixilated Heating," filed Nov. 20, 2013.
Taiwan Search Report of Taiwan Application No. 104120017 dated Aug. 20, 2018.
Chinese Search Report of Chinese Application No. 201580034345.1 dated Aug. 20, 2018.

* cited by examiner

APPARATUS, SYSTEMS, AND METHODS FOR TEMPERATURE CONTROL OF SUBSTRATES USING EMBEDDED FIBER OPTICS AND EPOXY OPTICAL DIFFUSERS

RELATED APPLICATIONS

This claims the benefit of U.S. Provisional Patent Application No. 62/020,367, filed Jul. 2, 2014, and titled "APPARATUS, SYSTEMS, AND METHODS FOR TEMPERATURE CONTROL OF SUBSTRATES USING EMBEDDED FIBER OPTICS AND EPOXY OPTICAL DIFFFUSERS", which is hereby incorporated by reference herein in its entirety for all purposes.

This is also related to U.S. Provisional Patent Application No. 62/020,370, filed Jul. 2, 2014, and titled "TEMPERATURE CONTROL APPARATUS INCLUDING GROOVE-ROUTED OPTICAL FIBER HEATING, SUBSTRATE TEMPERATURE CONTROL SYSTEMS, ELECTRONIC DEVICE PROCESSING SYSTEMS, AND PROCESSING METHODS", which is hereby incorporated by reference herein in its entirety for all purposes.

FIELD

The invention relates generally to electronic device manufacturing and more particularly to apparatus, systems, and methods for controlling temperature across a substrate during processing.

BACKGROUND

In an electronic device manufacturing system, a substrate, such as, e.g., an integrated circuit wafer, may be processed in a process chamber. Processing may include, e.g., one or more depositions, etches, and/or cleaning processes. A substrate may be positioned in a process chamber on a substrate holder, which in some systems may be an electrostatic chuck. The substrate holder may have embedded heaters configured to heat a substrate thereon to a selected temperature. A uniform temperature across the substrate is often desired because, in some processes, even small variations in temperature can adversely affect processing, which can render a substrate unusable. However, because of anomalies in the substrate (e.g., not perfectly flat), and/or limitations in some known embedded heater configurations, processes (e.g., variations in plasma density during a plasma etch), and/or process chamber configurations (e.g., proximity of a substrate holder to a chamber opening or other structure), substrates may not be uniformly heated. That is, one or more cold and/or hot spots may result across a substrate. Non-uniform heating of a substrate at one or more points or portions there across may thus be needed to provide the substrate with a uniform temperature. However, some known electronic device manufacturing systems may be limited in their ability to provide differing amounts of heat to specific points or portions of a substrate. In other cases it may be desired to create a specified non-uniform temperature distribution across a substrate to compensate for other non-uniformities. Examples may include controlling temperature to adjust an etch rate to compensate for non-uniform dimensions of structures or film thicknesses on the substrate as measured before the etch process starts. Another example may be to adjust a temperature profile to compensate for a non-uniform etch plasma profile. Accordingly, a need exists for improved heating and temperature control across a substrate being processed in an electronic device manufacturing system.

SUMMARY

According to one aspect, a substrate holder is provided. The substrate holder comprises a baseplate that comprises a plurality of cavities formed in a first surface of the baseplate and comprises a plurality of optical fibers, wherein each one of the plurality of optical fibers terminates in a respective one of the plurality of cavities and is configured to transmit light thereto.

According to another aspect, an electronic device manufacturing system is provided. The electronic device manufacturing system comprises a temperature detector, a light source, a light source controller coupled to the temperature detector and to the light source, and a process chamber. The process chamber is configured to receive one or more substrates and comprises a substrate holder coupled to the temperature detector and the light source. The substrate holder is configured to receive the one or more substrates thereon and comprises a baseplate. The baseplate comprises a plurality of cavities formed in a first surface of the baseplate, and a plurality of optical fibers wherein each one of the plurality of optical fibers has a first end and a second end, the first end terminating in a respective one of the plurality of cavities to transmit light thereto, and the second end coupled to the light source.

According to a further aspect, a method of controlling temperature across a substrate holder in an electronic device manufacturing system is provided. The method comprises providing a baseplate comprising a plurality of cavities formed in a first surface of the baseplate, and routing a plurality of optical fibers such that a first end of each optical fiber terminates in a respective one of the plurality of cavities.

Still other aspects, features, and advantages of the invention may be readily apparent from the following detailed description wherein a number of example embodiments and implementations are described and illustrated, including the best mode contemplated for carrying out the invention. The invention may also include other and different embodiments, and its several details may be modified in various respects, all without departing from the scope of the invention. Accordingly, the drawings and descriptions are to be regarded as illustrative in nature, and not as restrictive. The invention covers all modifications, equivalents, and alternatives of the aspects disclosed herein.

BRIEF DESCRIPTION OF THE DRAWINGS

Persons skilled in the art will understand that the drawings, described below, are for illustrative purposes only. The drawings are not necessarily drawn to scale and are not intended to limit the scope of this disclosure in any way.

DESCRIPTION

Reference will now be made in detail to the example embodiments of this disclosure, which are illustrated in the accompanying drawings. Wherever possible, the same reference numbers will be used throughout the drawings to refer to the same or like parts.

Improved substrate temperature control may increase the quality and yield of substrates processed in an electronic device manufacturing system. Spatial control of substrate temperature may provide a highly uniform temperature or a deliberately non-uniform temperature across a substrate, depending on various conditions associated with the processing of the substrate. Spatial control may include "pixelated" temperature control, which refers to control of an array of discrete temperature points. Pixelated temperature control may provide azimuthal (or non-radial) temperature variation across a substrate. Pixelated temperature control may be provided by a fiber optic based system employing a large number (e.g., 200 or more) of laser diodes, optical fibers, and thermal coupling sites embedded in a substrate holder of a process chamber in an electronic device manufacturing system. The substrate holder may be, e.g., an electrostatic chuck. The laser diodes, serving as a power source, may emit infrared energy through the optical fibers, which carry the infrared energy to the substrate holder. The infrared energy is transferred to the substrate holder at the thermal coupling sites embedded in the substrate holder. Each laser diode may be individually controlled to provide variable discrete point heating to the substrate holder.

In one aspect, a surface of a baseplate of a substrate holder may include a plurality of reflector cavities, which may serve as thermal coupling sites to a ceramic plate of the substrate holder upon which a substrate may be placed. The surface of the baseplate may also include a plurality of grooves connected to the reflector cavities. The grooves are configured to route an optical fiber to each one of the cavities to provide light thereto. In some embodiments, an epoxy may be applied to each one of the cavities to secure the optical fiber terminating therein and/or to diffuse the light emitted by the optical fiber to provide more even heat distribution. The ceramic plate may be bonded to the baseplate. In some embodiments, a thermal spreader plate may be bonded between the baseplate and the ceramic plate to further distribute the heat more evenly.

In other aspects, methods of controlling temperature across a substrate holder in an electronic device manufacturing system are provided, as will be explained in greater detail below in connection with FIGS. 1-10C.

Figure 1A:
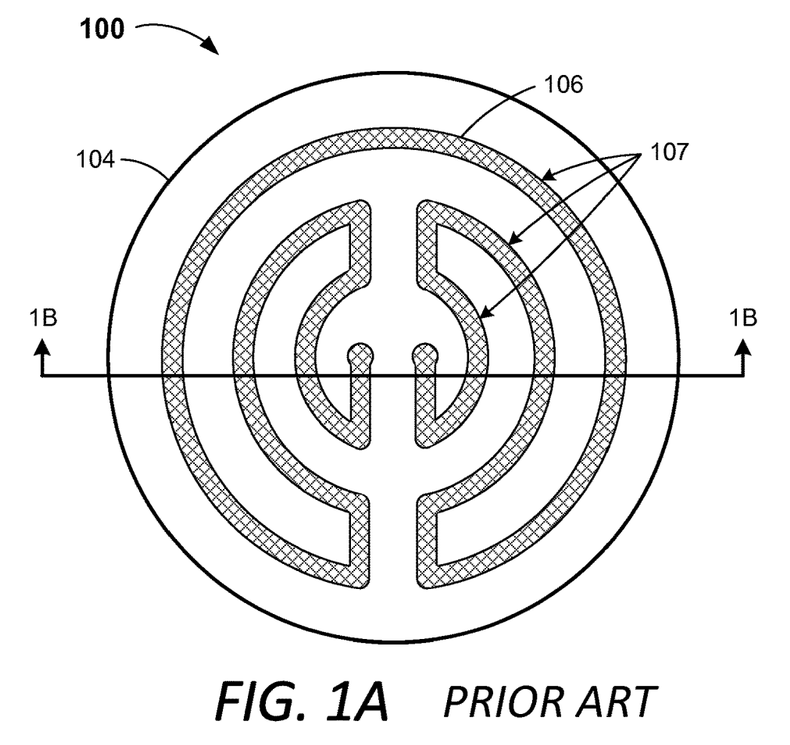
FIGS. 1A and 1B illustrate a schematic top view and a schematic cross-sectional side view, respectively, of a substrate holder according to the prior art.
Figure 1B:
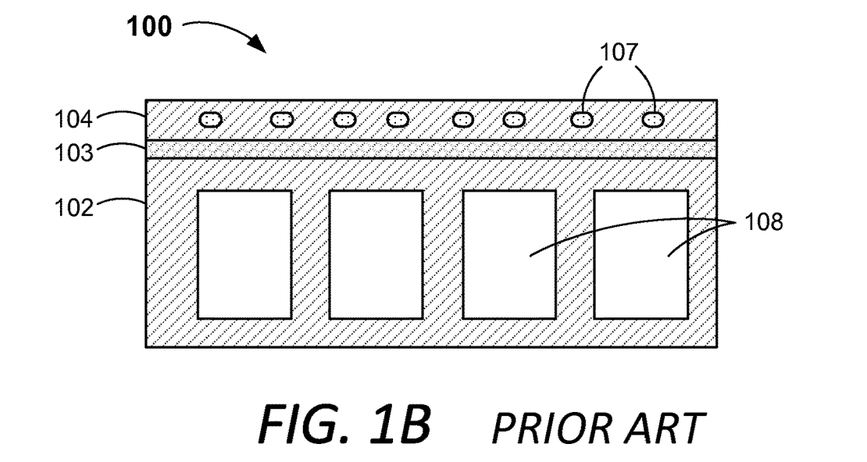

FIGS. 1A and 1B illustrate a known substrate holder 100 in accordance with the prior art. Substrate holder 100 may include a baseplate 102, a ceramic plate 104, an elastomer bond 103 disposed between baseplate 102 and ceramic plate 104, and a resistive heater 106, which is typically embedded in ceramic plate 104. Ceramic plate 104 may be configured to receive and heat a substrate positioned thereon. Baseplate 102 may serve as a heat sink and may include cooling channels 108 (only two are labeled in FIG. 1B) through which a coolant may flow. Baseplate 102 may accordingly also be referred to as a cooling plate. Elastomer bond 103 should be sufficiently flexible to allow ceramic plate 104 to move with respect to baseplate 102, as these two parts have different coefficients of thermal expansion and are generally at different temperatures. Elastomer bond 103 should also provide a thermal resistance between ceramic plate 104 and baseplate 102 such that resistive heater 106 can elevate the temperature of ceramic plate 104 above the temperature of baseplate 102.

Resistive heater 106 typically provides radial heating via annular and/or concentric heating traces 107 (only two are labeled in FIG. 1B). In some known substrate holders, resistive heater 106 may include electrically-separate heater traces that can be individually controlled to provide the substrate holder with separate radial heater zones (e.g., an outer zone, a middle zone, and an inner zone). Varying the heater power in the individual zones can create a radial temperature distribution (e.g., center hot and edge cool). However, these radial heater zones cannot control azimuthal (or non-radial) temperature variation, nor can they provide localized or discrete point heating variation.

Figure 2:
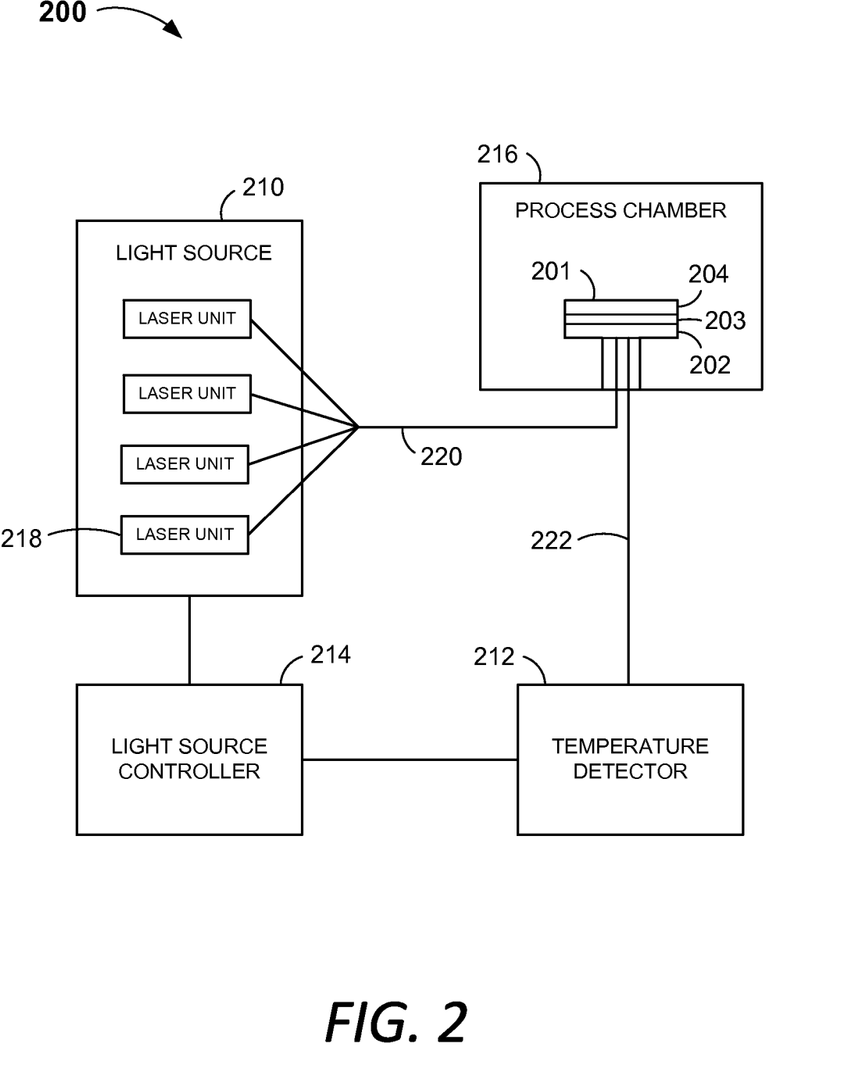
FIG. 2 illustrates a schematic view of an electronic device manufacturing system according to embodiments.
Figure 3A:
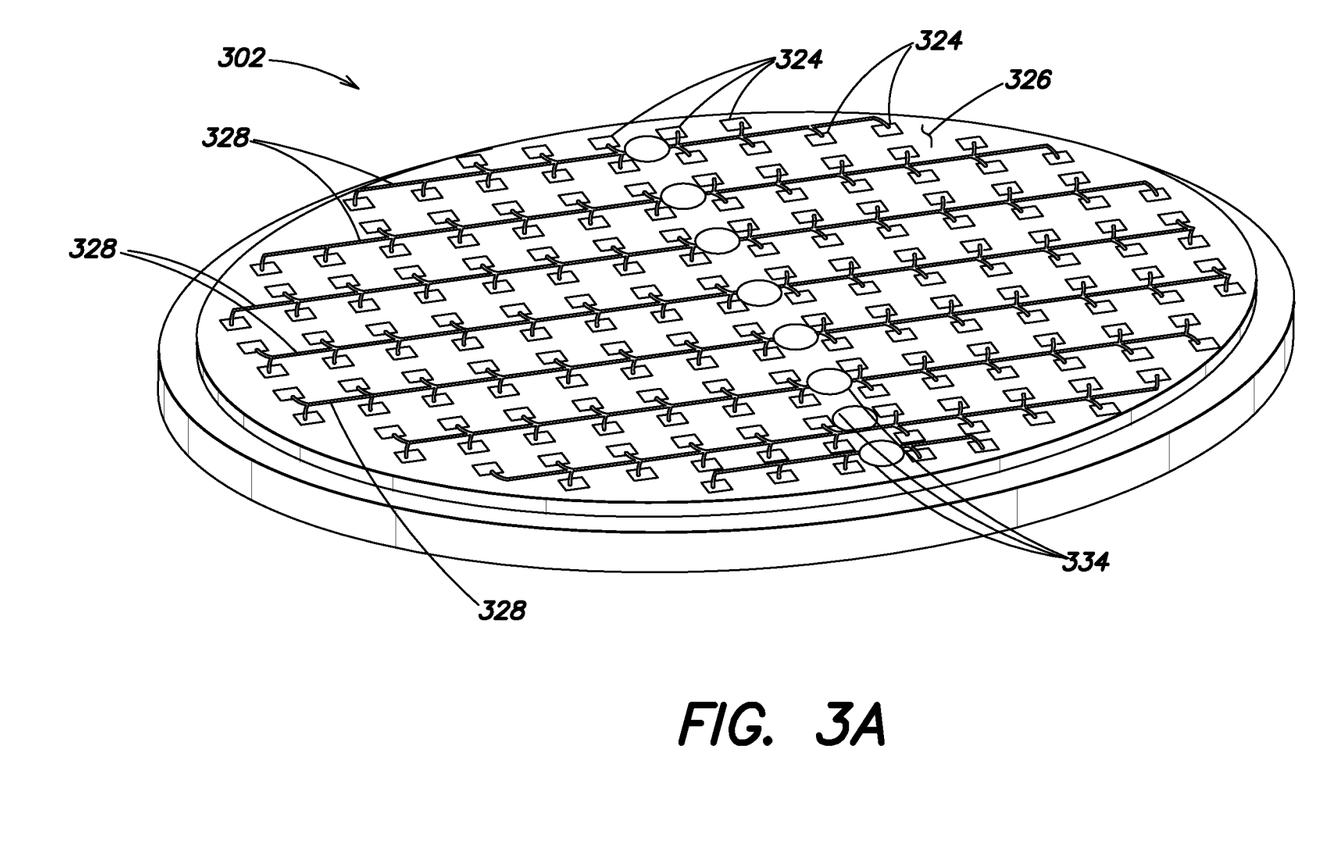
FIGS. 3A and 3B illustrate perspective and top views, respectively, of a substrate holder baseplate according to embodiments.
Figure 3B:
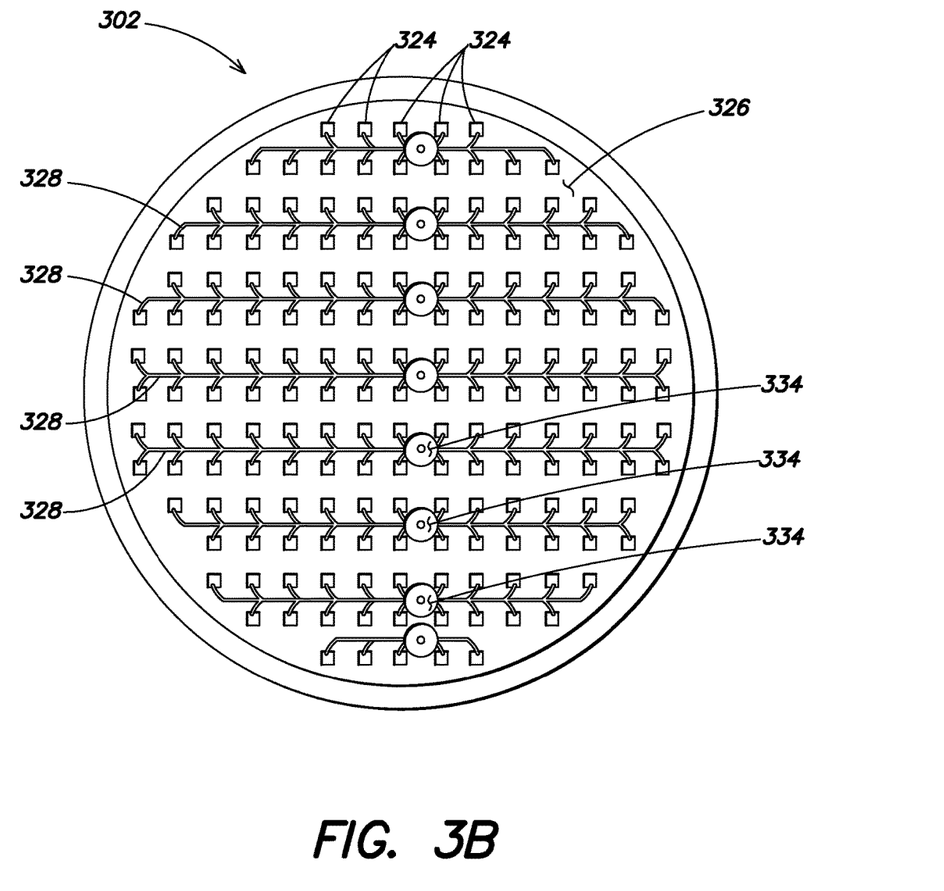

FIG. 2 illustrates an electronic device manufacturing system 200 in accordance with one or more embodiments. Electronic device manufacturing system 200 may include a light source 210, a temperature detector 212, a light source controller 214, and a process chamber 216. Process chamber 216 may be any suitable substrate processing chamber configured to perform any one or more depositions, etches, cleaning processes, and/or other suitable substrate processes. Process chamber 216 may include a substrate holder 201, which in some embodiments may be an electrostatic chuck.

Substrate holder 201 may include a baseplate 202, an elastomer bond 203, and a ceramic plate 204. In some embodiments, baseplate 202 may serve as a heat sink and may include cooling channels through which a coolant may flow, similar or identical to baseplate 102. In some embodiments, ceramic plate 204 may include an embedded resistive heater, similar or identical to resistive heater 106, and may be configured to receive and heat a substrate positioned thereon. Elastomer bond 203 may be similar or identical to elastomer bond 103.

Light source 210 may include a plurality of laser units 218 (only one of which is labeled in FIG. 2). (Light source 210 may have more or less than the four laser units 218 shown.) Each laser unit 218 may include twenty to two hundred laser diodes along with associated electronics and power supplies for adjusting the output power (i.e., light intensity) of each laser diode. The infrared energy emitted by the laser diodes may be transported via a bundle of optical fibers 220 (one optical fiber per laser diode) into substrate holder 201 to provide light thereto, which may be absorbed and converted to heat by ceramic plate 204. The temperature and/or temperature distribution provided across ceramic plate 204 of substrate holder 201 may be controlled by modulating the power emitted by each individual laser diode. Each laser diode may be individually controlled to output from a low or zero power level to a high or maximum power level. In those embodiments that include resistive heating, light source 210 may provide supplemental heating to substrate holder 201. In other embodiments, light source 210 may be the only heat source.

Temperature detector 212 may receive temperature feedback via a cable bundle 222 from temperature sensors (not shown) in thermal contact with, e.g., baseplate 202 and/or ceramic plate 204 of substrate holder 201. Cable bundle 222 may include optical fibers and/or other media suitable for communicating temperature. In some embodiments, temperature detector 212 may have processing capabilities and/or may communicate with other controllers and/or components of electronic device manufacturing system 200.

Light source controller 214 may be coupled to light source 210 and to temperature detector 212 and may be configured to control the output power of each laser diode in each laser unit 218. Light source controller 214 may thus set and control a selected temperature and/or temperature distribution across substrate holder 201. Based on feedback received from temperature detector 212, and/or programming executing in light source controller 214, and/or user input in the form of a table of set-point temperatures listed by location, light source controller 214 may be configured to adjust the temperature of substrate holder 201 either uniformly there across, across one or more localized regions (including, e.g., azimuthal regions), and/or at one or more discrete heating points by collectively controlling groups of the laser diodes or individual laser diodes. Thus, in accordance with the substrate process being performed in process chamber 216, and/or one or more associated conditions, light source controller 214 may provide a highly uniform temperature distribution or a deliberately non-uniform temperature distribution across a substrate being processed in process chamber 216. In some embodiments, light source controller 214 may provide any suitable temperature distribution profile. Light source controller 214 may be any suitable controller having a suitable processor, memory, and peripheral components configured to control the optical power output from light source 210. In some embodiments, light source controller 214 and/or the functions performed by light source controller 214 may additionally or alternatively be a subpart of, and/or incorporated in, an overall system controller of electronic device manufacturing system 200. The laser diodes may be a single emitter diode. The laser diode may have any suitable output wavelength range, such as between about 915 nm and about 980 nm, for example. Other output ranges may be used. Output power may be modulated between about 0 W to about 10 W. However, even higher power diodes (e.g., >10 W) may be used. The laser diode may include an optical fiber output having a 105 micron core diameter, for example. A model PLD-10 from IPG Photonics of Oxford, Mass. may be used, for example. Other types of light sources may be alternatively used.

Electronic device manufacturing system 200 may, in some embodiments, provide three levels of substrate temperature control. The first level may include cooling provided by cooling channels in some embodiments of baseplate 202. A second level may include heating provided by resistive heaters embedded in some embodiments of ceramic plate 204. And a third level may include pixelated heating provided by light source 210 to ceramic plate 204. The three levels of substrate temperature control may provide for very fine-tuning of substrate temperature distribution that, in some embodiments, may result in less than one degree C. of targeted temperature control across a 300 mm ceramic plate.

FIGS. 3A, 3B, 4A, and 4B illustrate a baseplate 302 that may be used in substrate holder 201 in accordance with one or more embodiments. Baseplate 302 may be made of aluminum or other suitable material. Baseplate 302 may include a plurality of reflector cavities 324 (of which only some are labeled in FIGS. 3A, 3B, 4A, and 4B) formed in a first surface 326 of baseplate 302. First surface 326 may be a top surface of baseplate 302. Reflector cavities 324 may have any suitable shape including, e.g., spherical, parabolic, and elliptical. Baseplate 302 may also include a plurality of grooves 328 (of which only some are labeled in FIGS. 3A, 3B, 4A, and 4B) also formed in first surface 326, wherein grooves 328 may be configured for optical fiber routing. The plurality of grooves 328 may extend laterally across first surface 326. Each one of the plurality of reflector cavities 324 may be connected to one of the plurality of grooves 328. Reflector cavities 324 may be electro-polished to create a smooth, mirror finish and, in some embodiments, may additionally be gold plated. Gold plating may be a desired mirror surface for infrared energy in the 900-1000 nm wavelength range. Other suitable materials may be used for plating of reflector cavities 324. Reflector cavities 324 and grooves 328 may each be formed in first surface 326 in any suitable manner, such as, e.g., any suitable machining or milling process. While reflector cavities 324 are shown in FIGS. 3A, 3B, 4A, and 4B in a regular grid pattern, in other embodiments, reflector cavities 324 may be configured in any suitable pattern, arrangement, and/or positions where reflector cavities 324 may optimally compensate for thermal non-uniformities. Also, the pattern of grooves 328 extending laterally across first surface 326 as shown in FIGS. 3A, 3B, 4A, and 4B may be configured in any suitable arrangement. Also note that in some embodiments baseplate 302 may have other numbers of reflector cavities 324 and/or grooves 328.

Figure 4A:
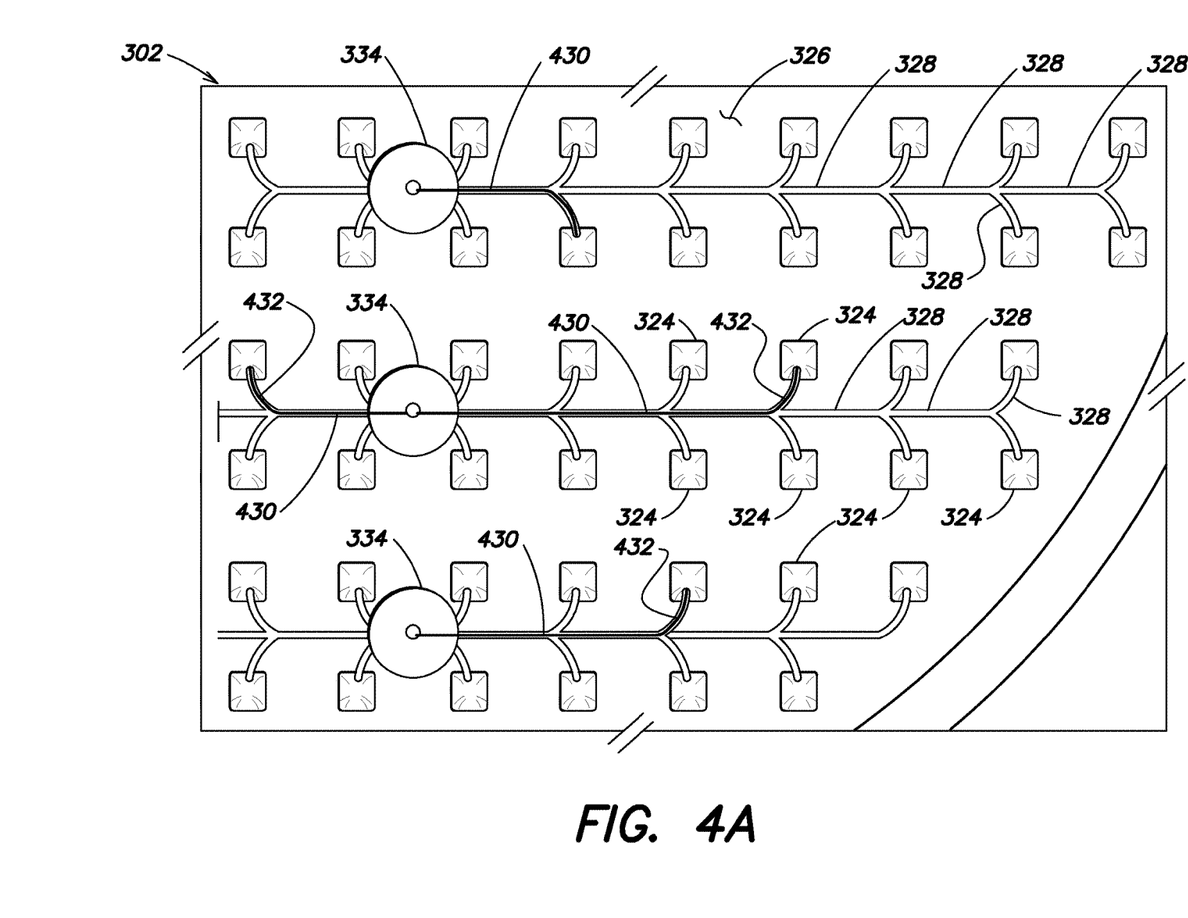
FIGS. 4A and 4B illustrate partial top and cross-sectional perspective views, respectively, of a substrate holder baseplate according to embodiments.
Figure 4B:
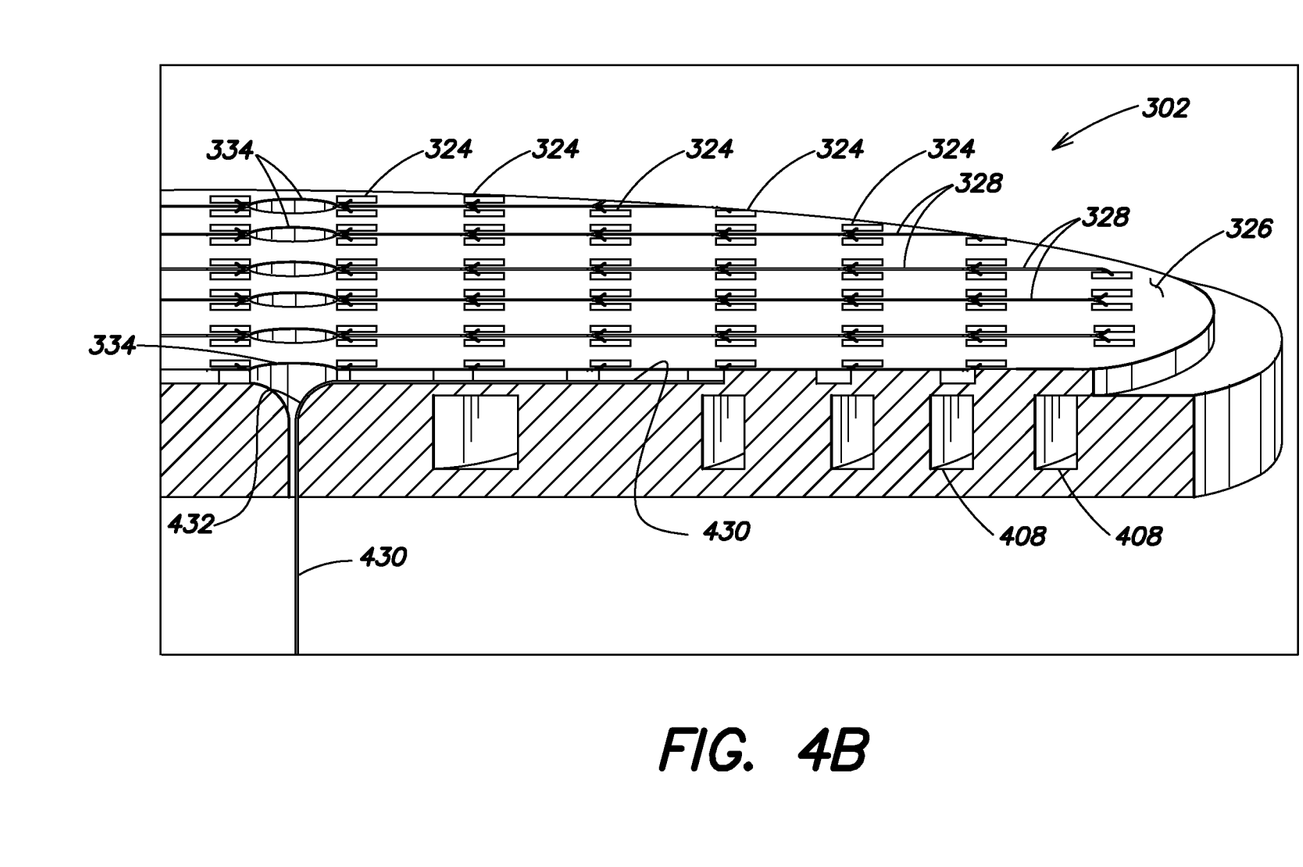
Figure 5:
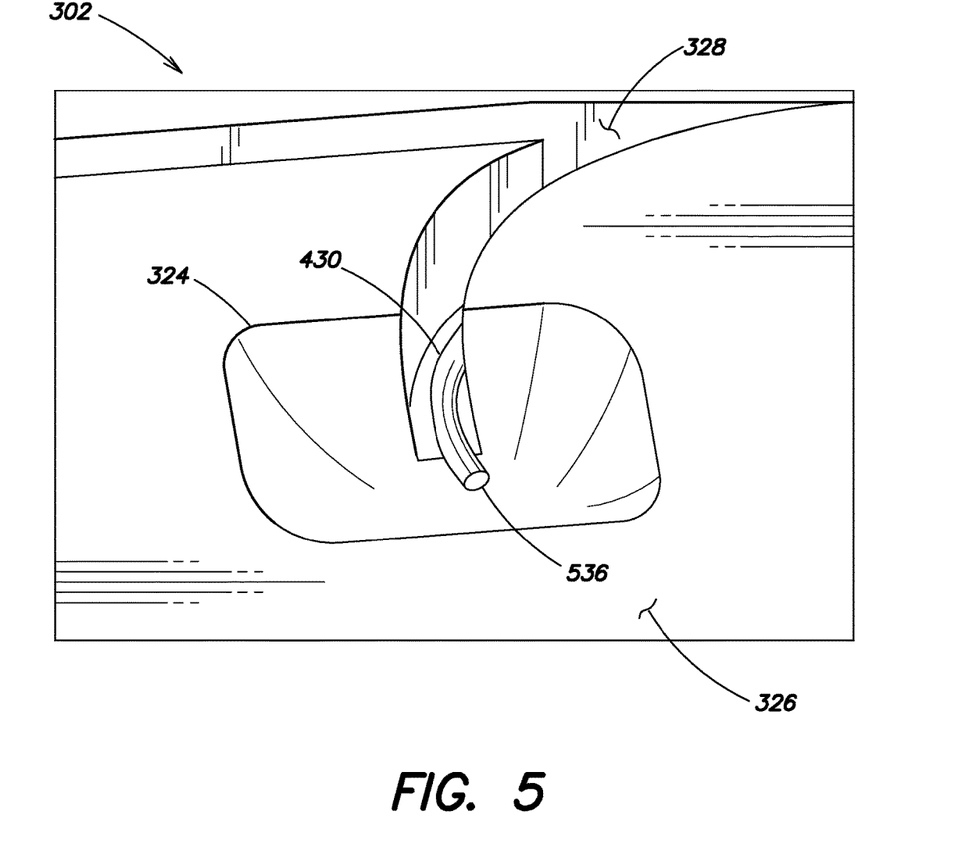
FIG. 5 illustrates a perspective view of a reflector cavity of a substrate holder baseplate according to embodiments.

Baseplate 302 may also include a plurality of optical fibers 430 received in the plurality of grooves 328 (wherein only four representative optical fibers 430 are shown in FIG. 4A and only one representative optical fiber 430 is shown in FIG. 4B for clarity). In some embodiments, an adhesive may be applied in some or all of grooves 328 to secure optical fibers 430 therein. Each one of the plurality of optical fibers 430 may terminate in a respective one of the plurality of reflector cavities 324. FIG. 5 illustrates an optical fiber 430 terminating in a reflector cavity 324. Each optical fiber 430 terminating in a reflector cavity 324 may be configured to transmit light to that reflector cavity 324 in such a way that the light at each location is directed from the cavity to the ceramic plate 204, and the light energy is absorbed by the ceramic plate to create heat. Optical fibers 430 may include any suitable optical fiber type, such as step-index multimode optical fiber. Optical fibers 430 that exhibit relatively high bend resistance may be used. Relatively high numerical aperture (NA) fibers may be used, such as NA of greater than about 0.2, greater than about 0.3, or even greater than about 0.4.

In some embodiments, optical fibers 430 may be positioned in grooves 328 and cavities 324 one at a time by hand. Some, if not all, of the plurality of optical fibers 430 may, in some embodiments, be gold-coated and pre-bent to conform to some of the plurality of grooves 328. That is, at least some of the plurality of optical fibers 430 may be annealed (i.e., heated to about 800 to 900 degrees C. in a vacuum or inert atmosphere) while constrained in a jig to bend the optical fiber 430 to a selected radius. Performing the anneal in a vacuum or inert atmosphere may prevent the optical fiber from degrading by absorption of hydroxyl (OH) or devitrification (recrystallization of the silica glass). Gold coating on the optical fiber provides protection at the elevated temperature. When heated, internal bending stress in optical fiber 430 should relax, allowing optical fiber 430 to be bent at a tight radius, such as those that may be used in grooves 328. Upon subsequent cooling, optical fiber 430 should retain the bent shape(s). This may allow the optical fibers 430 to be placed in grooves 328 without adhesive and may prevent optical fibers 430 from springing out of place. Also, the risk of optical fiber breakage and/or failure may be substantially reduced. As shown in FIG. 4A, one or more optical fibers 430 may have pre-bent sections 432. Additionally, fibers may be installed as bundles or harnesses. Heat shrink tubing of a suitable material such as PTFE may be used to construct the bundles.

Baseplate 302 may also include at least one feed-through hole 334 configured to receive a plurality of optical fibers 430 there through. Optical fibers 430 may be configured as a fiber bundle through feed-through hole 334. In some embodiments, baseplate 302 may include, e.g., eight feed-through holes 334 as shown (only three of which are labeled in FIGS. 3A, 3B, 4A, and 4B).

Baseplate 302 may further include a plurality of cooling channels 408 (shown in FIG. 4B) formed therein and configured to allow a coolant to circulate there through. The coolant may include any suitable gas or liquid. In some embodiments, the coolant may be supplied to baseplate 302 via a coolant source (not shown) coupled to baseplate 302.

Note that for clarity, some features of baseplate 302, which are known in the art, have been omitted from the FIGs., such as, e.g., wafer lift pins, temperature sensors, and feed-through holes for electrical connections to, e.g., a high voltage terminal for a clamp electrode (when baseplate 302 is used with an electrostatic chuck) and/or a heater embedded in a ceramic plate bonded to baseplate 302.

Figure 6A:
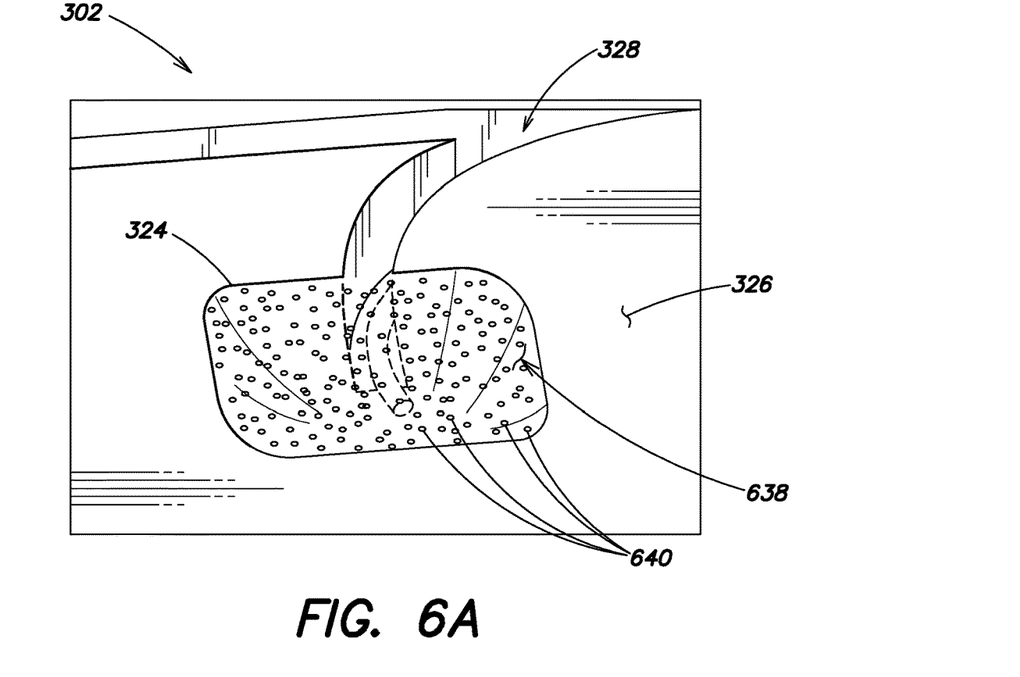
FIGS. 6A and 6B illustrate perspective and cross-sectional side views, respectively, of a reflector cavity of a substrate holder baseplate filled with an optical diffuser according to embodiments.
Figure 6B:
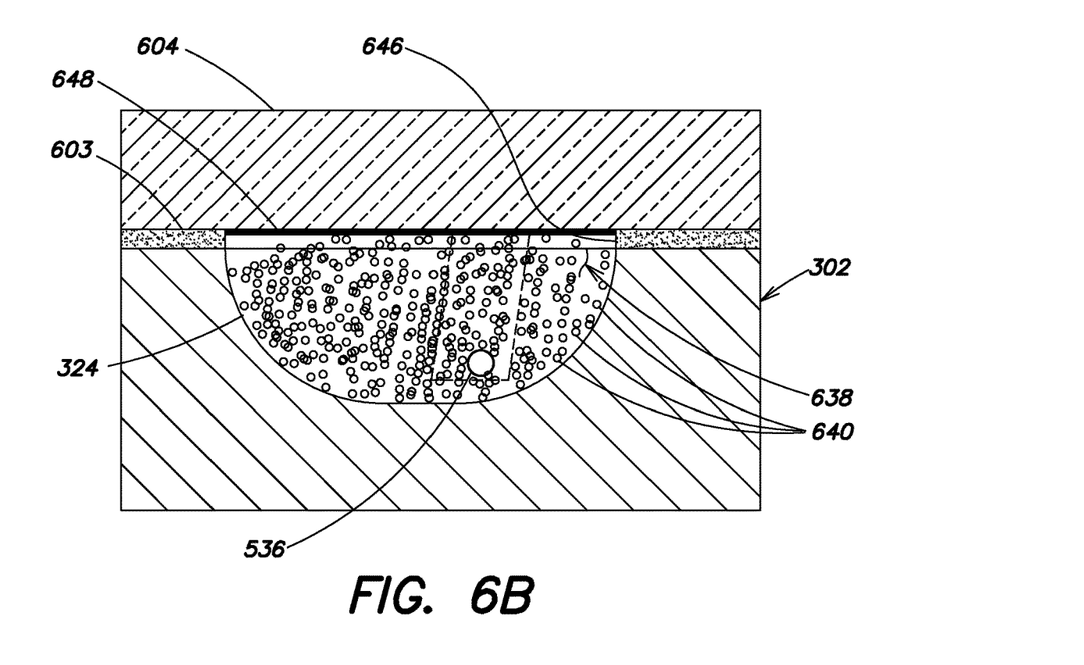

Referring to FIGS. 5, 6A, and 6B, a fiber tip 536 (i.e., an output end) of an optical fiber 430 may be secured in a reflector cavity 324 with an optically clear epoxy in accordance with one or more embodiments. Optically clear epoxies may be known in sensor encapsulation, and epoxy materials may exist that are highly transparent in the NIR (near-infrared) spectrum. Optically clear epoxies may be available in various viscosities, service temperature ranges, and flexibilities. One example may be Masterbond EP30LV-1, which may have about 97% transmittance over a wavelength range of about 900-1000 nm.

In some embodiments, the optically clear epoxy may be an epoxy optical diffuser 638 that may include particles 640 suspended therein as shown in FIGS. 6A and 6B. Particles 640 act as light scattering elements that may diffuse the light emitted by optical fiber 430. In some embodiments, an advantage of epoxy optical diffuser 638 may be that little or no power is reflected back into optical fiber 430. Particles 640 may be glass microspheres or other suitably sized particles. Glass microspheres may be available from, e.g., Cospheric LLC of Santa Barbara, Calif., in diameters ranging from about 17 microns to about 100 microns. In some embodiments, the glass microspheres may be metal-coated glass to improve light scattering. The metal coating may be, e.g., aluminum, silver, or gold. In some embodiments, particles 640 should be small relative to the diameter of optical fiber 430 (which may be, e.g., about 105 microns in some embodiments). Large particles may potentially and adversely obstruct fiber tip 536 of optical fiber 430, which may result in poor light diffusion and/or in light energy reflecting back into optical fiber 430.

Figure 7:
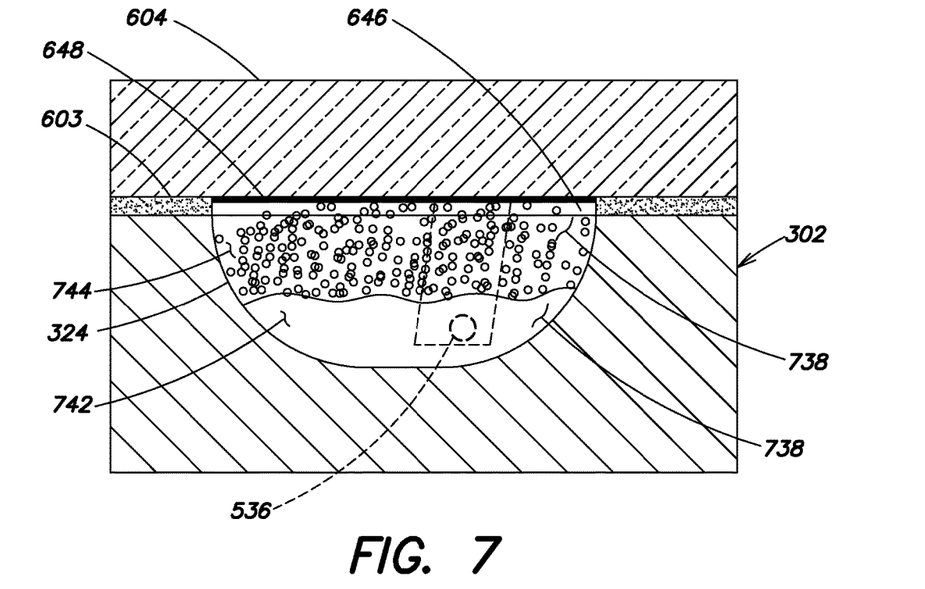
FIG. 7 illustrates a cross-sectional side view of a reflector cavity of a substrate holder baseplate filled with two layers of an optical diffuser according to embodiments.

As shown in FIG. 7, an epoxy optical diffuser 738 may be applied in two layers in accordance with one or more embodiments. A first layer 742 may be a particle-free optically clear epoxy applied over fiber tip 536 of optical fiber 430 to provide a minimum clearance between fiber tip 536 and any particles 640. A second layer 744 may be a particle-laden optically clear epoxy applied over first layer 742 to fill reflector cavity 324.

Note that in some embodiments, a suitable non-epoxy optical diffuser may be used instead of epoxy optical diffusers 638 and 738, wherein each optical fiber 430 may be alternatively secured in a respective reflector cavity 324. Optical diffusers (without epoxy) that may be used may be optically clear, particle free, particle laden, and/or combinations thereof.

Figure 10A:
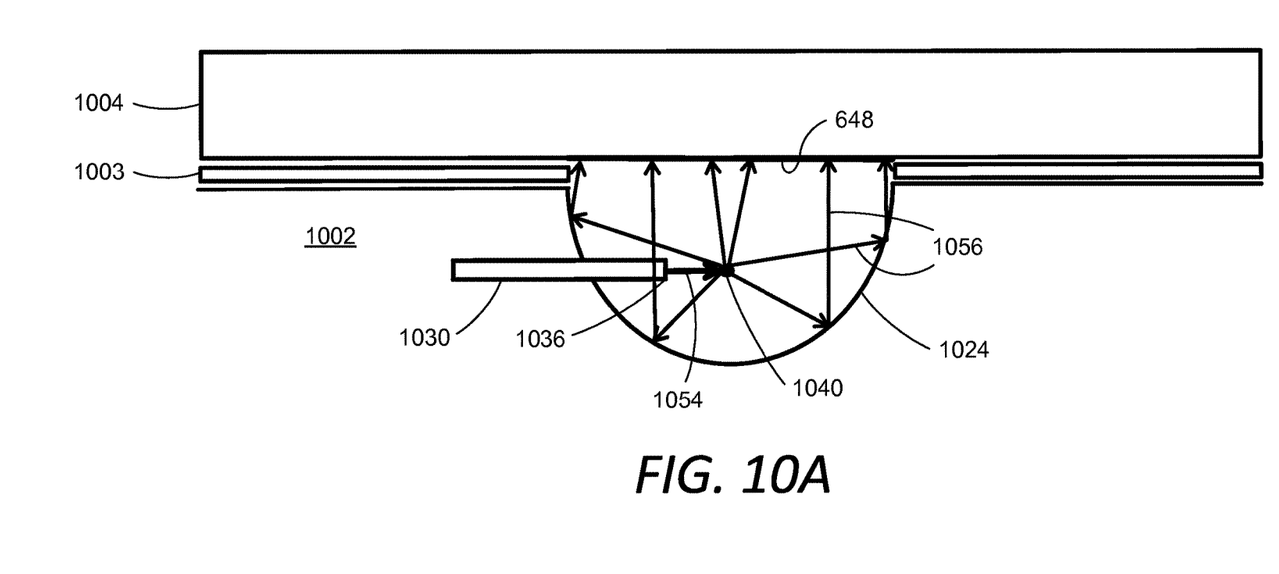
FIGS. 10A-C illustrate schematic side views of optical fiber and diffuser configurations according to embodiments.

Referring to FIG. 10A, a fiber tip 1036 may be secured in a reflector cavity 1024 such that light 1054 from optical fiber 1030 strikes an optical diffuser particle 1040 at roughly the focal point of the elliptical, parabolic, or spherical reflector cavity 1024. This may cause reflected light 1056 to be reflected from the reflecting surface of the reflector cavity through the elastomer bond 1003 layer to ceramic plate 1004, where reflected light 1056 may be absorbed and converted to heat. This scheme may allow baseplate 1002 and the optical fibers routed therein to operate at a temperature significantly lower than ceramic plate 1004 even though it is delivering energy to ceramic plate 1004.

Figure 10B:
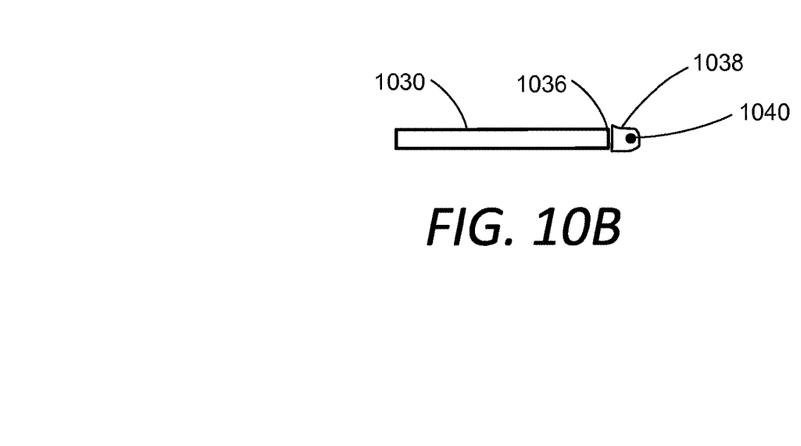
Figure 10C:
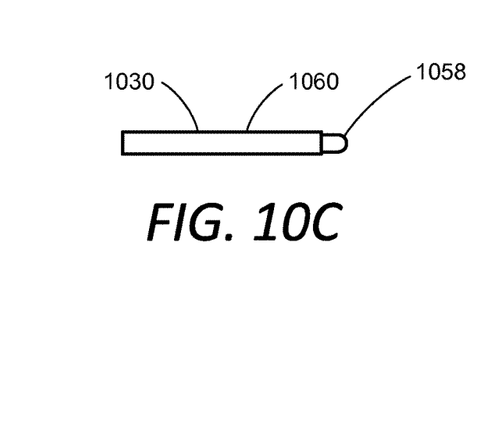

FIGS. 10B and 10C illustrate optical fiber and diffuser configurations such that light from the optical fiber may be optimally scattered into the surrounding reflector cavity with minimal back reflections into the optical fiber. In FIG. 10B, an optical diffuser 1038, such as the types described herein, may have diffuser particles 1040 of sufficient size such that diffuser particles 1040 receive all the light spreading from optical fiber 1030. Diffuser particles 1040 may be located near, but not necessarily at, fiber tip 1036 using optically clear epoxy or another suitable method. The distance between fiber tip 1036 and a diffuser particle 1040 may be determined by maximizing scattering efficiency and minimizing back reflections into the optical fiber.

FIG. 10C illustrates an alternative diffuser configuration wherein an inner core 1058 of optical fiber 1030 may be exposed by stripping an outer cladding 1060 and may have a surface roughened by chemical, laser, or mechanical means such that light piped into inner core 1058 exits in a diffuse manner. This type of diffuser tip optical fiber may be well known and may be used in catheter based medical applications such as photodynamic therapy or light activated chemotherapy.

Returning to FIGS. 6B and 7, after epoxy optical diffuser 638 or 738 has cured, first surface 326 of baseplate 302 may be machined and polished in some embodiments to obtain a clean, flat surface for bonding. An elastomer bond 603, which may be a material such as, e.g., an alumina doped silicone adhesive, may bond a ceramic plate 604 to baseplate 302. Elastomer bond 603 may have a through-hole 646 above each reflector cavity 324. Prior to bonding, an infrared absorbent coating 648 may be applied to a bottom surface of ceramic plate 604 (i.e., a surface adjacent to first surface 326 and each reflector cavity 324). Infrared absorbent coating 648 may be applied only to the areas above a reflector cavity 324 using, e.g., screen printing or a suitable mask. Infrared absorbent coating 648 may be any infrared absorbent material. For example, black paint may be a suitable material. Alternatively, coatings such as, e.g., Black Metal Velvet™ by Acktar Ltd. of Israel may be used. In some embodiments, infrared absorbent coating 648 may have a service temperature of up to 350 degrees C. and may be applied with a thickness of about 13 microns to about 25 microns.

Ceramic plate 604 may be configured to receive pixelated light-based heating via the plurality of optical fibers 430 terminating in the plurality of reflector cavities 324. In some embodiments, baseplate 302 and ceramic plate 604 may be used in an electrostatic chuck for substrate etch processes. In these applications, ceramic plate 604 may be relatively thin (e.g., from about 2 mm to about 5 mm). As such, ceramic plate 604 may not be thick enough for small heat sources to spread into a reasonably smooth surface temperature profile. For example, in some embodiments, surface temperatures of ceramic plate 604 may vary from about 38 degrees C. to a maximum of about 58 degrees C. directly above each reflector cavity 324 having an epoxy optical diffuser 638. In some embodiments, a thermal spreader plate 850 may be used to remedy the uneven surface temperature, as shown in a substrate holder 800 of FIGS. 8A and 8B.

Figure 8A:
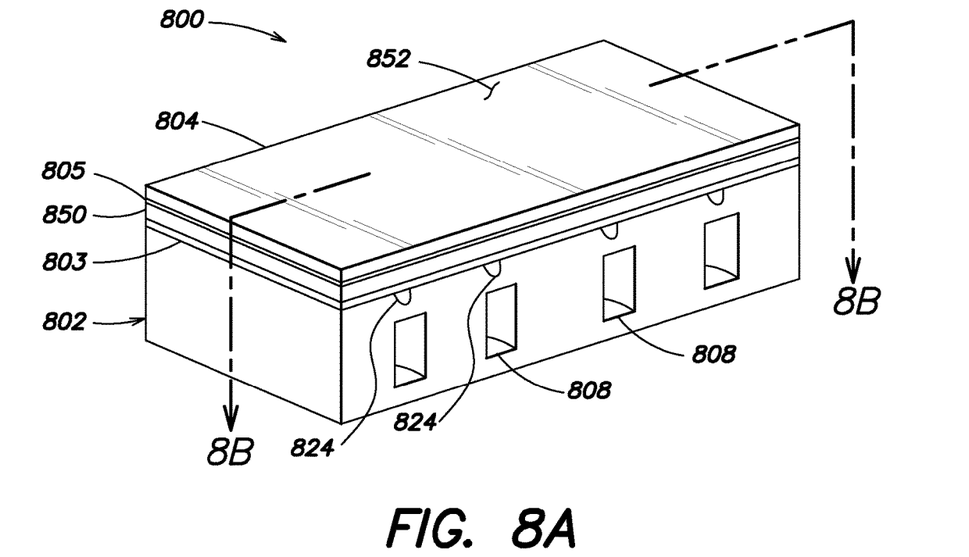
FIGS. 8A and 8B illustrate perspective and cross-sectional side views, respectively, of a substrate holder that includes a thermal spreader plate according to embodiments.
Figure 8B:
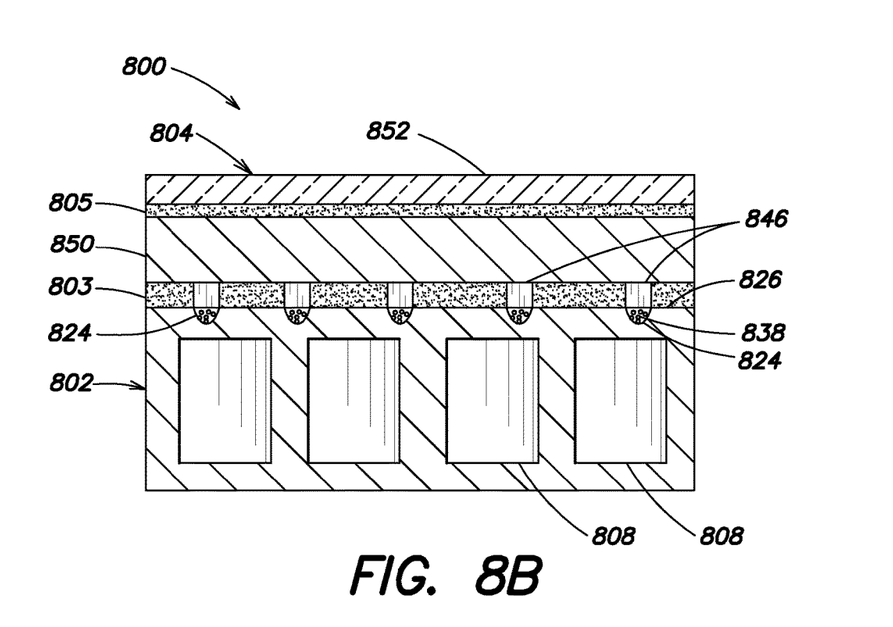

Thermal spreader plate 850 may transform laser energy heat into a suitable surface temperature profile. Thermal spreader plate 850 may be sandwiched between a ceramic plate 804 and a baseplate 802. Ceramic plate 804 may be similar or identical to ceramic plate 204 and/or 604 and may include an electrostatic electrode and an optional embedded resistive heater (neither shown). Baseplate 802 may be similar or identical to baseplate 302 and may include a plurality of reflector cavities 824 that may each be filled with an epoxy optical diffuser 838, which may be similar or identical to epoxy optical diffuser 638 or 738. Alternatively, non-epoxy optical diffusers may be used. Baseplate 802 may also include cooling channels 808, which may be similar or identical to cooling channels 108 or 408. Thermal spreader plate 850 may serve only to provide lateral thermal diffusion, and may be constructed of a high thermal conductivity material, such as, e.g., aluminum or aluminum nitride. Aluminum nitride may be selected because it has a low coefficient of thermal expansion. Other suitable materials may be used.

Thermal spreader plate 850 may be coupled to a first surface 826 of baseplate 802 via a first elastomer bond 803 disposed there between. First elastomer bond 803 may have a through-hole 846 (only two are labeled in FIG. 8B) positioned over each reflector cavity 824. First elastomer bond 803 may be similar or identical to elastomer bond 603. Prior to bonding, an infrared absorbent coating (not shown), similar or identical to infrared absorbent coating 648, may be applied to a bottom surface of thermal spreader plate 850 (i.e., a surface adjacent to first surface 826 and reflector cavities 824). The infrared absorbent coating may be applied only to the areas above a reflector cavity 824 using, e.g., screen printing or a suitable mask.

Ceramic plate 804 may be coupled to thermal spreader plate 850 via a second elastomer bond 805 disposed there between. Second elastomer bond 805 may be similar or identical to first elastomer bond 603 or 803.

In some embodiments, ceramic plate 804 may be about 2 mm thick, and an aluminum nitride thermal spreader plate 850 may be about 3 mm thick. The temperature variation across top surface 852 of ceramic plate 804 in those embodiments may be reduced to about 1° C.

Figure 9:
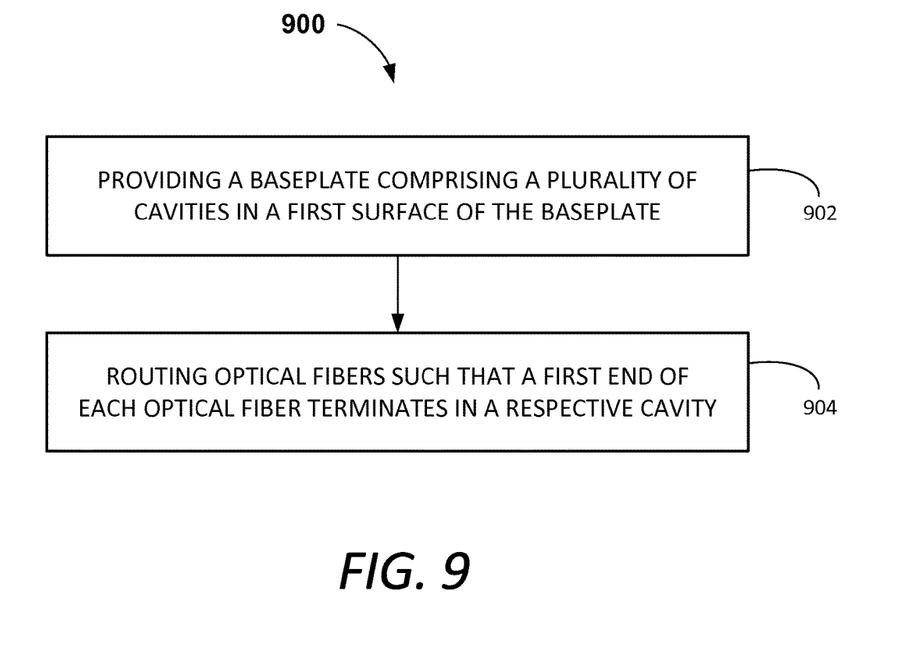
FIG. 9 illustrates a flowchart of a method of controlling temperature across a substrate holder in an electronic device manufacturing system according to embodiments.

FIG. 9 illustrates a method 900 of controlling temperature across a substrate holder in an electronic device manufacturing system in accordance with one or more embodiments. At process block 902, method 900 may include providing a baseplate comprising a plurality of cavities in a first surface of the baseplate. In some embodiments, the baseplate may be, e.g., baseplate 302 of FIGS. 3A, 3B, 4A, and 4B, wherein the first surface may be first surface 326, and the plurality of cavities may be reflector cavities 324. Other embodiments may have different numbers, patterns, and/or configurations of reflector cavities than those shown for reflector cavities 324.

At process block 904, method 900 may include routing a plurality of optical fibers such that a first end of each optical fiber terminates in a respective one of the plurality of cavities. As shown in FIGS. 4A, 4B, and 5, the plurality of optical fibers may be optical fibers 430, the first end may be fiber tip 536, and the plurality of cavities may be reflector cavities 324. Each optical fiber 430 may be routed such that fiber tip 536 of each optical fiber 430 terminates in a respective reflector cavity 324, as shown in FIG. 5.

In some embodiments, method 900 may include providing the baseplate such that the baseplate comprises a plurality of grooves in the first surface, wherein each one of the plurality of cavities is connected to one of the plurality of grooves. In some embodiments, the plurality of grooves may be grooves 328 of FIGS. 3A, 3B, 4A, and 4B. In other embodiments, the number, pattern, and/or configuration of the grooves may be different than those shown for grooves 328.

In some embodiments, method 900 may include applying an epoxy optical diffuser in at least some or all of the cavities. For example, in some embodiments, the epoxy optical diffuser may be epoxy optical diffuser 638 of FIGS. 6A and 6B, which may be applied to each reflector cavity 324 or only some of them. Epoxy optical diffuser 638 may include particles 640 suspended therein to act as light scattering elements to diffuse the light received from optical fiber 430.

In some embodiments, the applying of an epoxy diffuser may include applying a particle-free layer over each first end of each optical fiber terminated in one of the plurality of cavities, and then applying a particle-laden layer over the particle-free layer in each one of the plurality of cavities. For example, as shown in FIG. 7, the particle-free layer may be first layer 742, which may be applied over each fiber tip 536 (e.g., a first end) of each optical fiber 430 terminated in a reflector cavity 324. The particle-laden layer may be second layer 744, which may be applied over first layer 742 in each of reflector cavities 324.

In some embodiments, method 900 may also include coupling a thermal spreader plate to the first surface of the baseplate via a first elastomer bond disposed there between, and coupling a ceramic plate to the thermal spreader plate via a second elastomer bond disposed there between, the ceramic plate configured to receive and support a substrate thereon. For example, as shown in FIGS. 8A and 8B, the thermal spreader plate may be thermal spreader plate 850, which may be coupled to first surface 826 of baseplate 802 via first elastomer bond 803 disposed there between. And the ceramic plate may be ceramic plate 804, which may be coupled to thermal spreader plate 850 via a second elastomer bond 805 disposed there between.

In some embodiments, method 900 may also include applying an infrared absorbent coating to a bottom surface of a ceramic plate to be coupled to the first surface of the baseplate, the absorbent coating to be adjacent to each one of the plurality of cavities. As shown in FIG. 6B, the infrared absorbent coating may be infrared absorbent coating 648 applied to a bottom surface of ceramic plate 604 (i.e., a surface of ceramic plate 604 adjacent to first surface 326 and reflector cavities 324 of baseplate 302).

Some embodiments, or portions thereof, may be provided as a computer program product or software that may include a machine-readable medium having non-transient instructions stored thereon, which may be used to program a computer system, controller, or other electronic device to perform a process in accordance with one or more embodiments.

Persons skilled in the art should readily appreciate that the invention described herein is susceptible of broad utility and application. Many embodiments and adaptations of the invention other than those described herein, as well as many variations, modifications, and equivalent arrangements, will be apparent from, or reasonably suggested by, the invention and the foregoing description thereof, without departing from the substance or scope of the invention. For example, although described in connection with electronic device manufacturing systems, one or more embodiments of the invention may be used with other types of systems that require uniform or non-uniform heat distribution and temperature control across a workpiece. Accordingly, while the invention has been described herein in detail in relation to specific embodiments, it should be understood that this disclosure is only illustrative and presents examples of the invention and is made merely for purposes of providing a full and enabling disclosure of the invention. This disclosure is not intended to limit the invention to the particular apparatus, devices, assemblies, systems or methods disclosed, but, to the contrary, the intention is to cover all modifications, equivalents, and alternatives falling within the scope of the invention, as defined by the following claims.

What is claimed is:

1. A substrate holder, comprising:
    a baseplate comprising:
        a plurality of cavities formed in a top surface of the baseplate, each cavity of the plurality of cavaties having an opening on the top surface;
        a plurality of feedthrough holes extending from a back surface of the baseplate to the top surface of the baseplate; and
        a plurality of optical fiber bundles, each optical fiber bundle of the plurality of optical fiber bundles having a plurality of optical fibers, wherein at least a lengthwise portion of each one of the plurality of optical fiber bundles is disposed in a corresponding feedthrough hole, and each one of the plurality of optical fibers terminates in a respective one of the plurality of cavities and is configured to transmit light thereto.

2. The substrate holder of claim 1, further comprising a plurality of grooves formed in the top surface of the baseplate, wherein each one of the plurality of grooves is connected to one of the plurality of feedthrough holes, and, wherein each one of the plurality of cavities is connected to one of the plurality of grooves.

3. The substrate holder of claim 1, further comprising an optical diffuser disposed in at least some of the plurality of cavities.

4. The substrate holder of claim 3, wherein the optical diffuser comprises diffusing particles suspended therein.

5. The substrate holder of claim 3, wherein the optical diffuser comprises a diffusing particle located near an output end of an optical fiber of the plurality of optical fibers.

6. The substrate holder of claim 1, further comprising a ceramic plate coupled to the top surface of the baseplate via an elastomer bond disposed therebetween, the ceramic plate comprising an infrared absorbent coating adjacent each one of the plurality of cavities.

7. The substrate holder of claim 1, further comprising:
    a thermal spreader plate coupled to the top surface of the baseplate via a first elastomer bond disposed there between; and
    a ceramic plate coupled to the thermal spreader plate via a second elastomer bond disposed therebetween.

8. The substrate holder of claim 1, wherein at least some of the plurality of cavities are electro-polished, gold plated, or both.

9. The substrate holder of claim 2, wherein some of the plurality of optical fibers are pre-bent to conform to some of the plurality of grooves.

* * * * *